US012477651B2

(12) United States Patent
Fukao et al.

(10) Patent No.: US 12,477,651 B2
(45) Date of Patent: Nov. 18, 2025

(54) METHOD FOR MANUFACTURING STRETCHABLE CIRCUIT BOARD, METAL-CLAD LAMINATED SHEET, METAL FOIL WITH RESIN, STRETCHABLE CIRCUIT BOARD, AND STRETCHABLE CIRCUIT MOUNTED ARTICLE

(71) Applicant: PANASONIC INTELLECTUAL PROPERTY MANAGEMENT CO., LTD., Osaka (JP)

(72) Inventors: Tomohiro Fukao, Osaka (JP); Tomoaki Sawada, Osaka (JP); Kyosuke Michigami, Hyogo (JP); Qianying Li, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 190 days.

(21) Appl. No.: 18/410,564

(22) Filed: Jan. 11, 2024

(65) Prior Publication Data
US 2024/0147609 A1 May 2, 2024

Related U.S. Application Data

(63) Continuation of application No. PCT/JP2022/022219, filed on May 31, 2022.

(30) Foreign Application Priority Data

Sep. 16, 2021 (JP) .................. 2021-150912

(51) Int. Cl.
H05K 1/02 (2006.01)
H05K 1/18 (2006.01)
(Continued)

(52) U.S. Cl.
CPC .......... *H05K 1/0283* (2013.01); *H05K 1/181* (2013.01); *H05K 3/0058* (2013.01);
(Continued)

(58) Field of Classification Search
CPC ... H05K 1/0283; H05K 3/0094; H05K 3/4038
See application file for complete search history.

(56) References Cited

U.S. PATENT DOCUMENTS

2010/0230142 A1* 9/2010 Bamba ................. H05K 3/0055
174/255
2015/0294754 A1* 10/2015 Ohata .................. H05K 3/4632
156/60

(Continued)

FOREIGN PATENT DOCUMENTS

JP 2018-64063 4/2018
WO 2020/196745 10/2020

OTHER PUBLICATIONS

International Search Report issued in International Patent Application No. PCT/JP2022/022219, dated Sep. 6, 2022.

*Primary Examiner* — Sherman Ng
(74) *Attorney, Agent, or Firm* — GREENBLUM & BERNSTEIN, P.L.C.

(57) ABSTRACT

A method for manufacturing a stretchable circuit board includes preparing a laminate in which a metal layer and a first stretchable insulating layer are in contact with each other and a peel strength between the metal layer and the first stretchable insulating layer is 0.5 N/mm or more and 3.0 N/mm or less, a second stretchable insulating layer, and a fluid; forming a via leading from a first surface, in contact with the metal layer, of the first stretchable insulating layer to a second surface opposite to the first surface; filling the
(Continued)

fluid in the via; laminating the second stretchable insulating layer on the second surface to seal the via; and patterning the metal layer.

10 Claims, 4 Drawing Sheets

(51) Int. Cl.
*H05K 3/00* (2006.01)
*H05K 3/12* (2006.01)

(52) U.S. Cl.
CPC ......... *H05K 3/0094* (2013.01); *H05K 3/1283* (2013.01); *H05K 2201/0212* (2013.01)

(56) References Cited

U.S. PATENT DOCUMENTS

| | | | |
|---|---|---|---|
| 2015/0370016 A1* | 12/2015 | Kurizoe | G02B 6/1221 |
| | | | 156/150 |
| 2018/0110121 A1 | 4/2018 | Sugaya et al. | |
| 2018/0288881 A1* | 10/2018 | Ori | C25D 5/627 |
| 2022/0071014 A1* | 3/2022 | Ronay | H05K 1/189 |
| 2022/0167497 A1 | 5/2022 | Fukao et al. | |

\* cited by examiner

006# METHOD FOR MANUFACTURING STRETCHABLE CIRCUIT BOARD, METAL-CLAD LAMINATED SHEET, METAL FOIL WITH RESIN, STRETCHABLE CIRCUIT BOARD, AND STRETCHABLE CIRCUIT MOUNTED ARTICLE

TECHNICAL FIELD

The present disclosure relates to a method for manufacturing a stretchable circuit board, a metal-clad laminate, a metal foil with resin, a stretchable circuit board, and a stretchable circuit mounted article.

With advances in the electronics field, the demand for downsizing, thinning, weight saving, and densification of electronic devices and the like is further increasing. Furthermore, flexible devices that can be freely deformed and bent may be required in order to dispose the electronic devices on curved surfaces, uneven surfaces, and the like depending on the application. In recent years, circuit boards exhibiting stretchability have been proposed in response to this, but it is required to suppress breakage and increases in resistance value of wirings due to elongation of circuit boards, and it has been proposed to use liquid metals as stretchable wirings as in the stretchable circuit board described in Patent Literature 1.

As a circuit board using a liquid metal, there is described a circuit board including a substrate that has holes penetrating in the plate thickness direction; a first conductor layer that closes one of the holes; a liquid metal that is disposed in a recess formed by the hole and the first conductor layer; and a sealing film that covers the surface of the liquid metal. (Patent Literature 2)

However, according to the knowledge attained as a result of the inventors' research and development, in a case where the liquid metal is filled in the stretchable insulating layer of the stretchable circuit board by a method in which the liquid metal is sealed in the substrate with a sealing film as disclosed in Patent Literature 2, there are problems that fracture occurs between the stretchable insulating layer and the sealing film by the expansion and contraction of the stretchable insulating circuit board and the liquid metal leaks from the fractured site.

In a case where a stretchable circuit board is formed by a method in which grooves are formed in a stretchable insulating layer using a laser and the like, a fluid such as a liquid metal or a heat medium is filled in the grooves, and then the fluid is encapsulated inside the stretchable insulating layer by laminating a metal foil as well, there are problems that fracture occurs between the stretchable insulating layer and the metal foil by the expansion and contraction of the stretchable insulating layer since the close contact properties between the stretchable insulating layer and the metal foil are insufficient, and the fluid leaks from the fractured portion.

An object of the present disclosure is to provide a method for manufacturing a stretchable circuit board in which leakage of a fluid encapsulated inside a stretchable insulating layer is suppressed, a metal-clad laminate, a metal foil with resin, a stretchable circuit board, and a stretchable circuit mounted article.

CITATION LIST

Patent Literatures

Patent Literature 1: WO 2020/196745 A
Patent Literature 2: JP 2018-64063 A

SUMMARY OF INVENTION

A method for manufacturing a stretchable circuit board according to an aspect of the present disclosure includes: a step (1) of preparing a laminate in which a metal layer and a first stretchable insulating layer are in contact with each other and a peel strength between the metal layer and the first stretchable insulating layer is 0.5 N/mm or more and 3.0 N/mm or less, a second stretchable insulating layer, and a fluid; a step (2) of forming a via leading from a first surface (a1), in contact with the metal layer, of the first stretchable insulating layer to a second surface (a2) opposite to the first surface (a1); a step (3) of filling the fluid in the via; a step (4) of laminating the second stretchable insulating layer on the second surface (a2) to seal the via; and a step (5) of patterning the metal layer.

A metal-clad laminate according to an aspect of the present disclosure includes a metal layer, a stretchable insulating layer in contact with the metal layer, and a fluid, in which a via is provided inside the stretchable insulating layer and an opening leading to the via is provided on a surface, in contact with the metal layer, of the stretchable insulating layer, the fluid is encapsulated in the via, the stretchable insulating layer contains a thermosetting resin, and a peel strength between the metal layer and the stretchable insulating layer is 0.5 N/mm or more and 3.0 N/mm or less.

A metal foil with resin according to an aspect of the present disclosure includes a metal layer, a stretchable insulating layer in contact with the metal layer, and a fluid, in which a via is provided inside the stretchable insulating layer and an opening leading to the via is provided on a surface, in contact with the metal layer, of the stretchable insulating layer, the fluid is encapsulated in the via, the stretchable insulating layer contains an uncured or semi-cured product of a thermosetting resin, and a peel strength between the metal layer and the stretchable insulating layer is 0.5 N/mm or more and 3.0 N/mm or less when the stretchable insulating layer containing the thermosetting resin is cured.

In a stretchable circuit board according to an aspect of the present disclosure, the metal layer in the metal-clad laminate is a patterned circuit.

In a stretchable circuit mounted article according to an aspect of the present disclosure, an electronic component is mounted on the metal layer in the stretchable circuit board.

DESCRIPTION OF EMBODIMENTS

Figure 1:
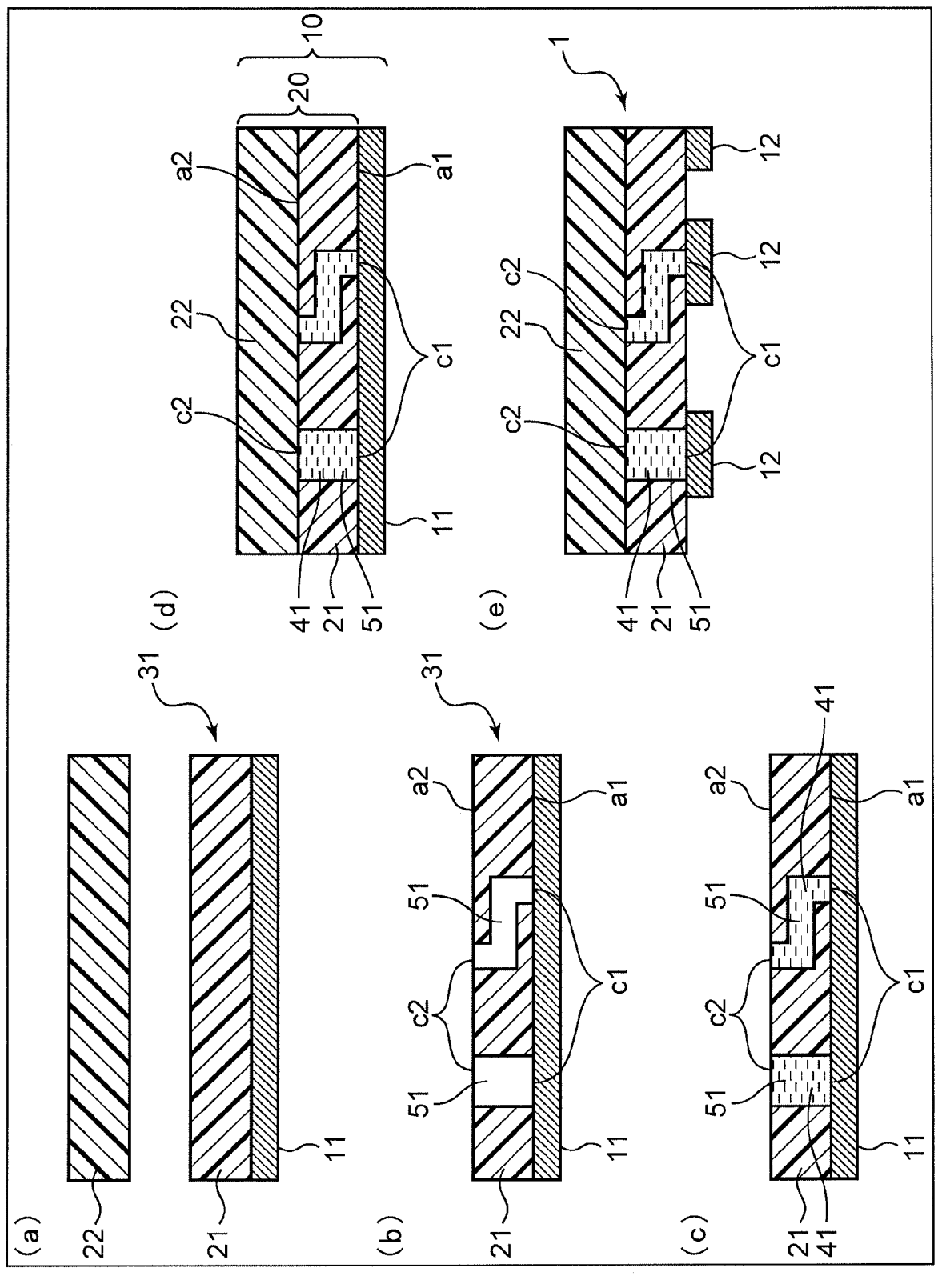
FIG. 1 is a schematic diagram illustrating a manufacturing process of a stretchable circuit board according to an embodiment of the present disclosure.

Hereinafter, an embodiment of the present invention will be described. The embodiment described below is only one of various embodiments of the present disclosure. The following embodiment can be modified in various ways depending on the design as long as the object of the present invention can be achieved.

The stretchable insulating layers (the first stretchable insulating layer and the second stretchable insulating layer) according to the present embodiment each exhibit stretchability. Here, "exhibiting stretchability" refers to being elastically deformable, and the stretchable insulating layers of the present embodiment preferably satisfy the tensile modulus and/or percentage elongation after fracture described below.

More specifically, the tensile modulus of the stretchable insulating layer is preferably 0.1 MPa or more. The upper limit is not particularly limited, but is preferably 100 MPa or less. The tensile modulus is more preferably 1.0 MPa or more and 50 MPa or less, still more preferably 1.5 MPa or more and 30 MPa or less.

The percentage elongation after fracture of the stretchable insulating layer according to the present embodiment is preferably 50% or more. In the present embodiment, the percentage elongation after fracture refers to the elongation rate until fracture, and is an index indicating the flexibility of the insulating layer together with the above-described tensile modulus. A more preferable percentage elongation after fracture is 100% or more and 500% or less. It is preferable as the upper limit of the percentage elongation after fracture in the present embodiment is as high as possible, but 1000% is sufficient.

A circuit board including a stretchable insulating layer having a tensile modulus and/or a percentage elongation after fracture within ranges as described above exhibits high followability when deformed into an arbitrary shape, and it is thus considered that, for example, a circuit board that exhibits excellent followability to clothing, is less likely to be fractured, and exhibits excellent stretchability can be obtained.

The tensile modulus and percentage elongation after fracture of the present embodiment are values measured by the following methods.

First, the cured product of a resin constituting the stretchable insulating layer is cut into a size of 90 mm×5.5 mm and attached to a universal testing machine (AGS-X manufactured by Shimadzu Corporation). Then, the test is conducted at room temperature (25° C.) and a tension speed of 500 mm/min, and the slope of r-σ (initial tensile modulus) is determined from all the stress (σ) data corresponding to the strain (r) at 1.0% to 5.0% elongation by the least squares method to calculate the tensile modulus.

Strain (r)=x/x0 (x is gripper moving distance, x0 is initial distance between grippers)

Stress (σ)=F/(d·l) (F is test force, d is film thickness, and l is width of test piece)

Regarding the percentage elongation after fracture, the percentage elongation when each cured resin film is fractured is measured using the testing machine.

The tensile stress of the stretchable insulating layer according to the present embodiment at 50% elongation is preferably 0.1 MPa or more and 20 MPa or less. "Tensile stress at 50% elongation" refers to the tensile stress when the percentage elongation reaches 50% in the above-described tensile test, and is an index indicating the flexibility of the stretchable insulating layer together with the above-described tensile modulus. As the tensile stress at 50% elongation is within the above range, the stretchable insulating layer exhibits high followability when deformed into an arbitrary shape (similarly to the tensile modulus described above), and there is an advantage that wirings and component mounted portions are less likely to be fractured. A more preferable range of the tensile stress is 0.5 MPa or more and 15 MPa or less.

A method for manufacturing a stretchable circuit board 1 according to the present embodiment includes: a step (1) of preparing a laminate 31 in which a metal layer 11 and a first stretchable insulating layer 21 are in contact with each other, a second stretchable insulating layer 22, and a fluid 41; a step (2) of forming a via 51 leading from a first surface (a1), in contact with the metal layer 11, of the first stretchable insulating layer 21 to a second surface (a2) opposite to the first surface (a1); a step of (3) filling the fluid 41 in the via 51; a step (4) of laminating the second stretchable insulating layer 22 on the second surface (a2) to seal the via 51; and a step (5) of patterning the metal layer 11.

According to such a manufacturing method, it is possible to manufacture a stretchable circuit board in which leakage of the fluid encapsulated inside the stretchable insulating layer is suppressed.

In the drawings and the following description, each reference symbol indicates 1: stretchable circuit board, 10: metal-clad laminate, 11: metal layer, 20: stretchable insulating layer, 21: first stretchable insulating layer, 22: second stretchable insulating layer, 31: laminate, 41: fluid, 51: via, 90: electronic component, and 100: stretchable circuit mounted article.

The step (1), as illustrated in FIG. 1(a), is a step of preparing a laminate 31 in which a metal layer 11 and a first stretchable insulating layer 21 are in contact with each other, a second stretchable insulating layer 22, a fluid 41 (not illustrated). The laminate 31 is formed by laminating and integrating the metal layer 11 and the first stretchable insulating layer 21. The method for laminating and integrating the metal layer 11 and the first stretchable insulating layer 21 is not particularly limited, and examples thereof include a method in which a resin layer to become the first stretchable insulating layer 21 is formed on the metal layer 11 by resin varnish application or the like and then heating and drying is performed, or a method in which the first stretchable insulating layer 21, which is a sheet-like resin film, and the metal layer 11 are bonded together by molding such as hot pressing. Alternatively, the first stretchable insulating layer 21 and the metal layer 11 may be bonded together using an adhesive, or a metal layer may be formed on the surface of the stretchable insulating layer by electroless plating, electrolytic plating, vapor deposition, or the like.

In the present embodiment, the peel strength between the metal layer 11 and the first stretchable insulating layer 21 is 0.5 N/mm or more and 3.0 N/mm or less. As the peel strength is 0.5 N/mm or more, peeling off of the metal layer 11 and the first stretchable insulating layer 21 from each other due to elongation of the stretchable circuit board 1, heating during mounting of electronic components, and the like is suppressed, and it is possible to prevent leakage of the fluid 41 encapsulated in the first stretchable insulating layer 21. It is preferable as the upper limit of the peel strength between the metal layer 11 and the first stretchable insulating layer 21 is as high as possible, but 3.0 N/mm is sufficient. The peel strength is more preferably 1.0 N/mm or more, still more preferably 1.5 N/mm or more.

Examples of the metal layer 11 used in the present embodiment include a metal foil, and more specific examples thereof include copper foil, aluminum foil, and nickel foil. The thickness of the first stretchable insulating layer 21 is preferably 10 μm or more and 500 μm or less.

The step (2), as illustrated in FIG. 1(b), is a step of forming a via (flow channel) 51 leading from a first surface (a1), in contact with the metal layer 11, of the first stretchable insulating layer 21 to a second surface (a2) opposite to the first surface (a1) in the laminate 31. The via 51 leads from a first opening (c1) formed on the first surface (a1) to a second opening (c2) formed on the second surface (a2). The shape of the via 51 may be a shape extending straight from the first surface (a1) toward the second surface (a2) like the via 51 on the left side in FIG. 1(b), or may be a bent shape like the via 51 on the right side in FIG. 1(b). The first opening (c1) is preferably formed so that the first stretchable insulating layer 21 is removed and the metal layer 11 is exposed. The width of the via 51 is preferably 0.1 μm or more, more preferably 1 μm or more, still more preferably 10 μm or more. The width of the via 51 is preferably 5 mm or less, more preferably 3 mm or less, still more preferably 1 mm or less.

Examples of the method for forming the via 51 include a method in which a groove is formed in the first stretchable insulating layer by cutting by laser processing or the like and a method in which a groove is formed by etching.

The step (3) is a step of filling the fluid 41 in the via 51, as illustrated in FIG. 1(c). By filling various kinds of fluids 41 from the second opening (c2), the region from the first opening (c1) to the second opening (c2) can be filled with the fluid 41.

Examples of the fluid 41 include a liquid metal or a heat medium. Examples of the liquid metal that can be used in the present embodiment include gallium simple substance or gallium/indium alloy, gallium/indium/tin alloy, and gallium/indium/tin/zinc alloy. Examples of the heat medium that can be used in the present embodiment include liquid paraffin, silicone-based heat medium, synthetic heat medium oil, and liquid nitrogen. The fluid 41 may contain incompatible fine particles within an amount range in which the fluidity of the fluid 41 is not impaired. Examples of the fine particles include silica, alumina, titanium oxide, aluminum nitride, and boron nitride.

The step (4), as illustrated in FIG. 1(d), is a step of laminating and integrating the second stretchable insulating layer 22 on the second surface (a2) of the first stretchable insulating layer 21 to seal the via 51 and encapsulate the fluid 41 in the via 51 after the step (3). Through the steps, a metal-clad laminate 10 is formed in which the metal layer 11 and the stretchable insulating layer 20 that is formed of the first stretchable insulating layer 21 and the second stretchable insulating layer 22 and includes the via 51 having the fluid 41 encapsulated inside are laminated. As the second stretchable insulating layer 22, it is preferable to use a sheet-like resin film. The thickness of the second stretchable insulating layer 22 is preferably 10 μm or more. The upper limit of the thickness of the second stretchable insulating layer 22 is not particularly limited, but is preferably 1 mm or less, more preferably 500 μm or less.

The step (5), as illustrated in FIG. 1(e), is a step of performing etching or the like on the metal layer 11 in the metal-clad laminate 10 to form a circuit (wiring) and obtaining a stretchable circuit board 1 having a surface on which a patterned circuit 12 is laid. By forming a circuit pattern (conductor wiring) while leaving the metal layer 11 that seals the first opening (c1), it is possible to obtain the stretchable circuit board 1 in which the fluid 41 is encapsulated in the stretchable insulating layer. Examples of the circuit forming method include circuit formation by a semi additive process (SAP) or a modified semi additive process (MSAP) in addition to the method described above.

Figure 2:
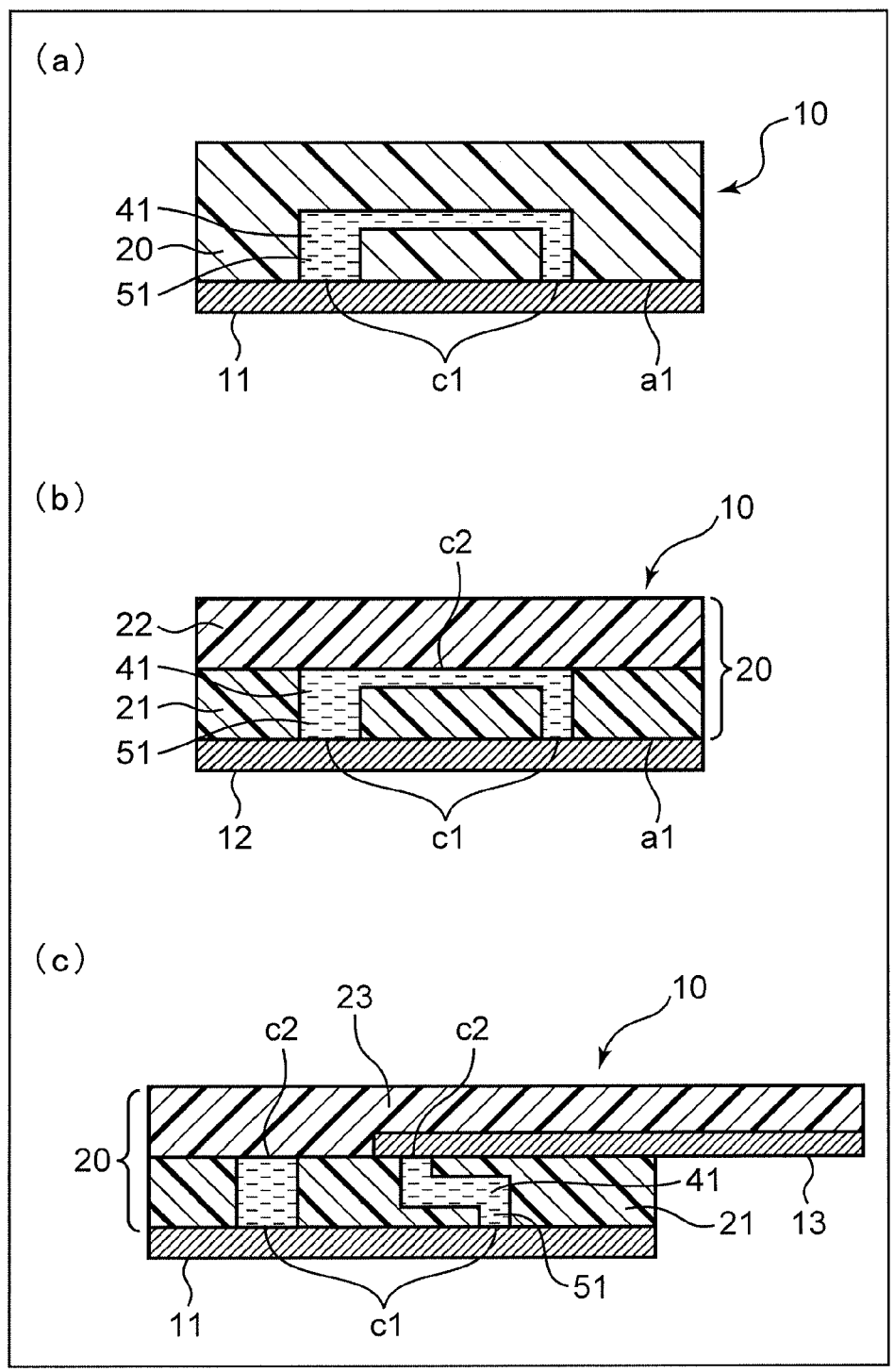
FIG. 2 is a schematic cross-sectional view illustrating a metal-clad laminate according to an embodiment of the present disclosure.

The metal-clad laminate 10 according to the present embodiment is obtained at the time of completion of the step (4) in the method for manufacturing a stretchable circuit board, and as illustrated in FIG. 2, includes the metal layer 11, the stretchable insulating layer 20 in contact with the metal layer 11, and the fluid 41, the via 51 is provided inside the stretchable insulating layer 20, the opening (c1) is provided on the surface (a1), in contact with the metal layer 11, of the stretchable insulating layer 20, the via 51 leads to the opening (c1), and the fluid 41 is encapsulated in the via 51. In the metal-clad laminate 10 according to the present embodiment, the peel strength between the metal layer 11 and the stretchable insulating layer 20 is 0.5 N/mm or more and 3.0 N/mm or less. As the peel strength between the metal layer 11 and the stretchable insulating layer 20 is 0.5 N/mm or more, fracture is less likely to occur at the interface between the metal layer 11 and the stretchable insulating layer 20 in a case where the stretchable insulating layer 20 is elongated as well, and it is possible to prevent leakage of the fluid 41 encapsulated in the via 51 formed in the metal-clad laminate 10. In the stretchable circuit board 1 formed using the metal-clad laminate 10, it is possible to prevent leakage of the fluid 41 encapsulated in the via 51. In the metal-clad laminate according to the present embodiment, the peel strength is more preferably 1.0 N/mm or more, still more preferably 1.5 N/mm or more. It is preferable as the upper limit of the peel strength between the metal layer 11 and the first stretchable insulating layer 20 is as high as possible, but 3.0 N/mm is sufficient.

The stretchable insulating layer 20 of the present embodiment is preferably formed of a curable resin composition or a thermoplastic resin composition. The curable resin composition used preferably contains a thermosetting resin, and is more preferably one that exhibits sufficient heat resistance to the temperature at which an electronic component and a circuit board are bonded with solder or the like using a reflow oven or a soldering iron. It is desirable that the softening point or melting point of the thermoplastic resin is 140° C. or more, preferably 160° C. or more, more preferably 180° C. or more. It is considered that this allows the thermoplastic resin composition to reliably withstand the heating temperature during mounting with solder.

Examples of the resin contained in the curable resin composition that can be used for the stretchable insulating layer 20 of the present embodiment include thermoplastic resins and thermosetting resins. Examples of the thermoplastic resin include urethane resins, various kinds of rubber, acrylic resins, olefin-based resins, ethylene propylene diene rubber, isoprene rubber, butadiene rubber, and chloroprene rubber. In particular, from the viewpoint of excellent adhesive properties and heat resistance and the viewpoint of being able to impart functions such as low thermal expansion, modulus control, thermal conductivity, and light reflectivity, it is preferable to use a curable resin composition containing a thermosetting resin. As the thermosetting resin, it is preferable to use at least one selected from epoxy resins, urethane resins, silicone resins, polyrotaxane resins, isocyanate resins, polyol resins, hydrogenated styrene-based elastomer resins, and acrylic acid ester copolymer resins. Among these, it is more preferable to use epoxy resins, and it is still more preferable to use an alkylene oxide modified epoxy resin or an epoxy resin containing a divalent organic group having 2 to 5000 carbon atoms.

Furthermore, the resin composition may contain various additives such as a curing agent, a curing accelerator, and a filler within a range in which the effects of the present invention are not impeded.

Specific examples of the resin composition that can be used for the stretchable insulating layer 20 include a resin composition containing polyrotaxane, a thermosetting resin, and a curing agent (for example, the resin compositions described in WO 2015/052853 A and the like).

The metal-clad laminate 10 according to the present embodiment may be a metal-clad laminate in which the stretchable insulating layer 20 is formed of one layer as illustrated in FIG. 2(a), or may be a metal-clad laminate in which the stretchable insulating layer 20 is formed of a plurality of stretchable insulating layers laminated.

From the viewpoint of easily manufacturing the metal-clad laminate by the manufacturing method described above, the metal-clad laminate 10 is preferably a metal-clad laminate in which the stretchable insulating layer 20 is formed of a plurality of stretchable insulating layers laminated.

For example, as illustrated in FIG. 2(b), the metal-clad laminate 10 in which a plurality of stretchable insulating layers are laminated may be the metal-clad laminate 10 in which the stretchable insulating layer 20 includes the first stretchable insulating layer 21 and the second stretchable insulating layer 22, the metal-clad laminate 10 includes the metal layer 11, the first stretchable insulating layer 21, and the second stretchable insulating layer 22 in this order, the first stretchable insulating layer 21 has the first surface (a1) in contact with the metal layer 11 and the second surface (a2) in contact with the second stretchable insulating layer 22, the first surface (a1) has the first opening (c1), the second surface (a2) has the second opening (c2), and the via 51 leads from the first opening (c1) to the second opening (c2). The peel strength between the first stretchable insulating layer 21 and the second stretchable insulating layer 22 is preferably 0.5 N/mm or more, more preferably 1.0 N/mm or more, still more preferably 1.5 N/mm or more. It is preferable as the upper limit of the peel strength between the first stretchable insulating layer 21 and the second stretchable insulating layer 22 is as high as possible, but 3.0 N/mm is sufficient. The thickness of the stretchable insulating layer 20 is preferably 20 μm or more. The upper limit of the thickness of the stretchable insulating layer 20 is not particularly limited, but is preferably 1 mm or less, more preferably 500 μm or less.

In a case where the stretchable insulating layer 20 includes a plurality of stretchable insulating layers, the respective stretchable insulating layers may be formed of the same resin, or may be formed of different resins. In other words, in the case of the laminated sheet 10 as illustrated in FIG. 2(b), the first stretchable insulating layer 21 and the second stretchable insulating layer 22 may be formed of the same resin composition, or may be formed of different compositions. Preferably, from the viewpoint of close contact properties between the stretchable insulating layers, it is desirable that the stretchable insulating layers are formed of the same resin composition.

In the method for manufacturing the stretchable circuit board 1 according to the present embodiment, in a case where the stretchable insulating layer (in a case where the stretchable insulating layer includes the first stretchable insulating layer 21 and the second stretchable insulating layer 22, at least one of these) contains an uncured or semi-cured thermosetting resin, the method preferably includes a step (6) of curing the uncured or semi-cured thermosetting resin between the step (4) and the step (5). The step (6) is a step of promoting the lamination and integration of the metal layer 11 and the stretchable insulating layer 20 by heating a laminate including a stretchable insulating layer containing an uncured or semi-cured product of a thermosetting resin to attain desired peel strength for each. Furthermore, in a case where the stretchable insulating layer includes the first stretchable insulating layer 21 and the second stretchable insulating layer 22, by the step (6), lamination and integration of the first stretchable insulating layer 21 and the second stretchable insulating layer 22 is also promoted and the desired peel strength can be attained. The heating may be accompanied by pressurization, and the pressure may be applied before or after the heating. The heating may be performed under vacuum degassing. The conditions for heating and pressurization can be appropriately set within a preferable range depending on the kind and content of the resin as a main ingredient, and the like.

In the embodiment including the second stretchable insulating layer 22, since the metal-clad laminate 10 illustrated in FIG. 2(c) has a configuration in which the second stretchable insulating layer 22 is replaced with a third stretchable insulating layer (23) laminated on a part of the surface of a metal layer 13 and the opening (c2) is sealed by the metal layer 13, it is possible to electrically connect the metal layer 11 and the metal layer 13 to each other, for example, in a case where the fluid 41 is a liquid metal.

Figure 3:
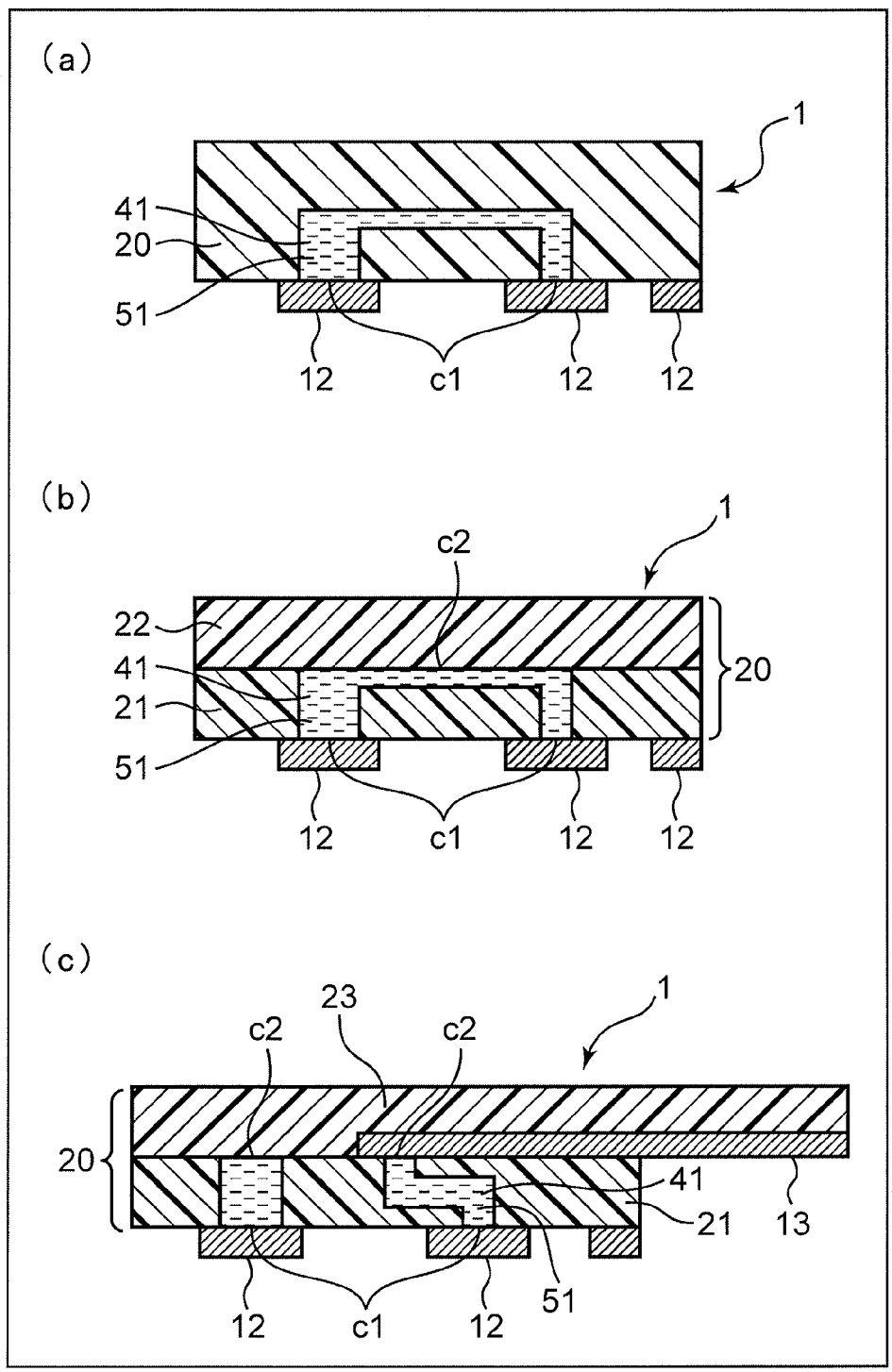
FIG. 3 is a schematic cross-sectional view illustrating a stretchable circuit board according to an embodiment of the present disclosure.

The stretchable circuit board 1 according to the present embodiment can be manufactured by processing a circuit on the metal layer 11 in the metal-clad laminate 10, and the stretchable circuit boards 1 illustrated in FIGS. 3(a) to 3(c) can be manufactured, respectively, by processing a circuit on the metal layer 11 in the metal-clad laminates 10 illustrated in FIGS. 2(a) to (c).

In the stretchable circuit boards 1 illustrated in FIGS. 3(a) and 3(b), the via 51 leading from one first opening (c1) to another first opening (c1) in the stretchable insulating layer 20 is formed to penetrate the inside of the stretchable insulating layer 20, and it is possible to electrically connect the separated circuits 12 that seal the respective openings (c1) to each other, for example, in a case where a liquid metal as the fluid 41 is encapsulated in the via 51.

Since the stretchable circuit board 1 illustrated in FIG. 3(c) has a configuration in which the metal layer 13 seals the opening (c2), it is possible to electrically connect at least a part of the circuit 12 and the metal layer 13 to each other, for example, in a case where the fluid 41 is a liquid metal.

The via 51 may be connected to an external flow channel of the stretchable insulating layer 20 (not illustrated), or a via may be formed in which the heat medium can circulate between the inside of the stretchable insulating layer 20 and an external heat exchanger, for example, in a case where the fluid 41 is a heat medium.

Figure 4:
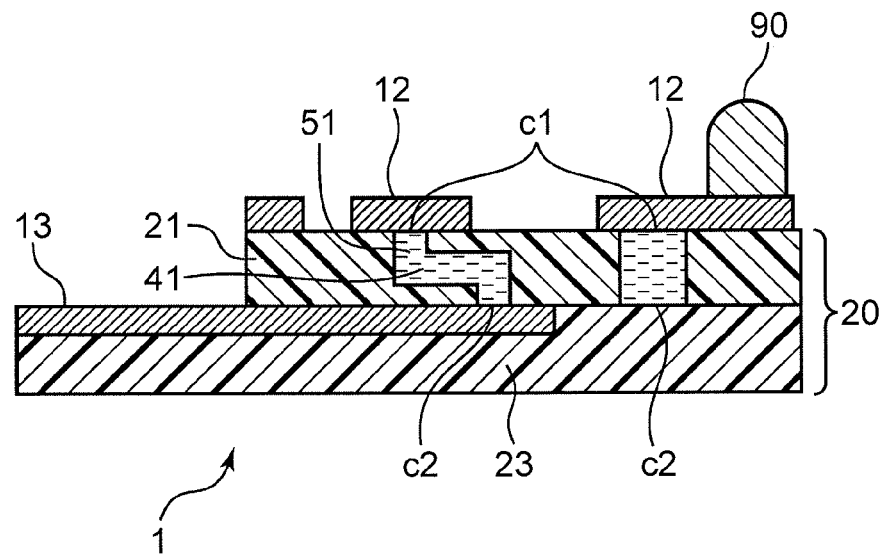
FIG. 4 is a schematic cross-sectional view illustrating a stretchable circuit mounted article according to an embodiment of the present disclosure.

The stretchable circuit mounted article according to the present embodiment can be manufactured by mounting an electronic component (90) on the circuit 12 of the stretchable circuit board 1. The place (right above the opening (c1) in FIG. 4) where the opening (c1) sealed by the circuit 12 is located is less stable than the place where the opening (c1) is not located, so it is preferable that the connected site between the electronic component (90) and the circuit 12 is at a location different from the place where the opening (c1) sealed by the circuit 12 is located.

Figure 5:
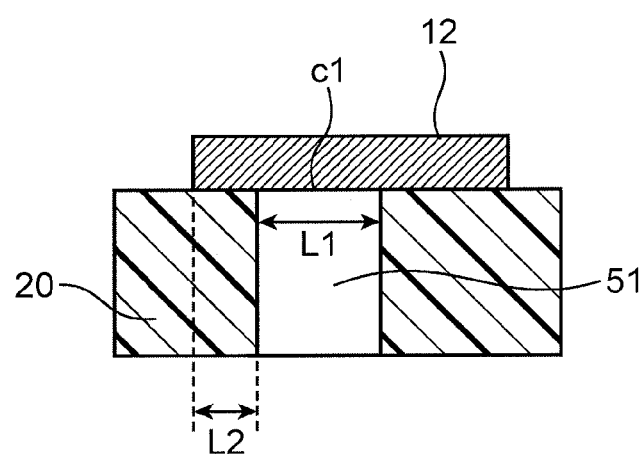
FIG. 5 is an enlarged view of a site where a circuit is formed in a schematic cross-sectional view of a stretchable circuit board according to an embodiment of the present disclosure.

FIG. 5 is an enlarged cross-sectional view of a site where the opening (c1) of the via 51 is sealed in the stretchable circuit board 1. At the site where the opening (c1) is sealed by the circuit 12, the ratio (L2/L1) of the shortest distance L2 from the edge of the opening (c1) to the edge of the circuit 12 where the circuit 12 and the stretchable insulating layer 20 are laminated and integrated to the maximum distance L1 of the opening (c1) is preferably 0.5 or more. L2/L1 is still more preferably 1 or more, still more preferably 2 or more. The upper limit of L2/L1 is not particularly limited, but is preferably 50 or less, more preferably 25 or less, preferably 5 or less. This makes it possible to sufficiently secure close contact force between the circuit 12 and the stretchable insulating layer 20 in the stretchable circuit board 1, and it is thus possible to more effectively prevent leakage of the fluid 41 encapsulated in the via 51 in the stretchable circuit board 1.

L1 is preferably 0.1 μm or more, more preferably 1 μm or more, still more preferably 10 jam or more. L1 is preferably 5 mm or less, more preferably 3 mm or less, still more preferably 1 mm or less.

A metal foil with resin in the present embodiment includes a metal layer, a stretchable insulating layer in contact with the metal layer, and a fluid, a via is provided inside the stretchable insulating layer and an opening leading to the via is provided on the surface, in contact with the metal layer, of the stretchable insulating layer, and the fluid is encapsulated in the via. The stretchable insulating layer contains an uncured or semi-cured product of a thermosetting resin. The peel strength between the metal layer and the stretchable insulating layer is 0.5 N/mm or more and 3.0 N/mm or less in a case where the stretchable insulating layer containing the thermosetting resin is cured. As the metal layer, stretchable insulating layer, and fluid in the metal foil with resin of the present embodiment, the same metal layer, stretchable insulating layer, and fluid as those in the metal-clad laminate described above are used.

As the peel strength between the metal layer and the stretchable insulating layer is 0.5 N/mm or more, fracture is less likely to occur at the interface between the metal layer and the stretchable insulating layer in a case where the cured stretchable insulating layer is elongated as well, and it is possible to prevent leakage of the fluid encapsulated in the via. The peel strength is more preferably 1.0 N/mm or more, still more preferably 1.5 N/mm or more. It is preferable as the upper limit of the peel strength between the metal layer and the first stretchable insulating layer is as high as possible, but 3.0 N/mm is sufficient.

By using the metal foil with resin of the present embodiment, a metal-clad laminate as described above can also be manufactured. For example, in a case where the stretchable insulating layer includes a first stretchable insulating layer and a second stretchable insulating layer, a stretchable circuit board can be obtained by heating and pressurizing a metal foil with resin including the metal layer, the first stretchable insulating layer, and the second stretchable insulating layer in this order.

This application is based on Japanese Patent Application No. 2021-150912 filed on Sep. 16, 2021, the contents of which are included in the present application.

In order to express the present invention, the present invention has been described above appropriately and sufficiently through the embodiments with reference to specific examples, drawings and the like. However, it should be recognized by those skilled in the art that changes and/or improvements of the above-described embodiments can be readily made. Accordingly, changes or improvements made by those skilled in the art shall be construed as being included in the scope of the claims unless otherwise the changes or improvements are at the level which departs from the scope of the appended claims.

INDUSTRIAL APPLICABILITY

The present disclosure has wide industrial applicability in technical fields related to various electronic materials and electronic devices.

The invention claimed is:

1. A method for manufacturing a stretchable circuit board, the method comprising:
   preparing
      a laminate in which a metal layer and a first stretchable insulating layer are in contact with each other and a peel strength between the metal layer and the first stretchable insulating layer is 0.5 N/mm or more and 3.0 N/mm or less,
      a second stretchable insulating layer, and
      a fluid;
   forming a via leading from a first surface, in contact with the metal layer, of the first stretchable insulating layer to a second surface opposite to the first surface;
   filling the fluid in the via;
   laminating the second stretchable insulating layer on the second surface to seal the via; and
   patterning the metal layer.

2. The method for manufacturing the stretchable circuit board according to claim 1, wherein
   at least one of the first stretchable insulating layer and the second stretchable insulating layer contains an uncured or semi-cured thermosetting resin, and
   the method further comprises curing the uncured or semi-cured thermosetting resin between the laminating of the second stretchable insulating layer and the patterning of the metal layer.

3. A metal-clad laminate comprising:
   a metal layer;
   a stretchable insulating layer in contact with the metal layer; and
   a fluid,
   wherein a via is provided inside the stretchable insulating layer and an opening leading to the via is provided on a surface, in contact with the metal layer, of the stretchable insulating layer,
   the fluid is encapsulated in the via,
   the stretchable insulating layer contains a thermosetting resin, and
   a peel strength between the metal layer and the stretchable insulating layer is 0.5 N/mm or more and 3.0 N/mm or less.

4. The metal-clad laminate according to claim 3, wherein the stretchable insulating layer has a tensile modulus of 0.1 MPa or more and 100 MPa or less.

5. The metal-clad laminate according to claim 3, wherein the thermosetting resin contains an epoxy resin.

6. The metal-clad laminate according to claim 3, wherein the fluid is at least one selected from a liquid metal and a heat medium.

7. The metal-clad laminate according to claim 3, wherein
the stretchable insulating layer includes a first stretchable insulating layer and a second stretchable insulating layer,
the metal-clad laminate comprises the metal layer, the first stretchable insulating layer, and the second stretchable insulating layer in this order,
the first stretchable insulating layer has a first surface in contact with the metal layer and a second surface in contact with the second stretchable insulating layer,
the first surface has a first opening and the second surface has a second opening, and
the via leads from the first opening to the second opening.

8. A stretchable circuit board wherein the metal layer in the metal-clad laminate according to claim 3 is a patterned circuit.

9. A stretchable circuit mounted article wherein an electronic component is mounted on the metal layer in the stretchable circuit board according to claim 8.

10. A metal foil with resin comprising:
a metal layer;
a stretchable insulating layer in contact with the metal layer; and
a fluid,
wherein a via is provided inside the stretchable insulating layer and an opening leading to the via is provided on a surface, in contact with the metal layer, of the stretchable insulating layer,
the fluid is encapsulated in the via,
the stretchable insulating layer contains an uncured or semi-cured product of a thermosetting resin, and
a peel strength between the metal layer and the stretchable insulating layer is 0.5 N/mm or more and 3.0 N/mm or less when the stretchable insulating layer containing the thermosetting resin is cured.

* * * * *